US006762824B2

(12) United States Patent
Mori

(10) Patent No.: US 6,762,824 B2
(45) Date of Patent: Jul. 13, 2004

(54) CORRECTION APPARATUS THAT CORRECTS OPTICAL SHIFT IN TWO OPTICAL UNITS, AND EXPOSURE APPARATUS HAVING THE SAME

(75) Inventor: Ken Ichiro Mori, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 156 days.

(21) Appl. No.: 10/052,093

(22) Filed: Jan. 16, 2002

(65) Prior Publication Data

US 2002/0154282 A1 Oct. 24, 2002

(30) Foreign Application Priority Data

Jan. 26, 2001 (JP) ......................................... 2001-018629

(51) Int. Cl.[7] ........................ G03B 27/68; G03B 27/42; G03B 27/54
(52) U.S. Cl. .............................. 355/52; 355/53; 355/67
(58) Field of Search ............................ 355/52, 53, 67; 359/212, 213, 222, 223, 226

(56) References Cited

U.S. PATENT DOCUMENTS

| 5,963,306 | A | * | 10/1999 | Tanitsu et al. ................. 355/67 |
| 6,008,885 | A | * | 12/1999 | Takahashi et al. ............. 355/67 |
| 6,445,362 | B1 | * | 9/2002 | Tegreene ......................... 345/7 |
| 6,542,222 | B1 | * | 4/2003 | Tsuji et al. .................... 355/67 |
| 6,597,002 | B1 | * | 7/2003 | Kondo ..................... 250/492.2 |
| 2002/0001134 | A1 | * | 1/2002 | Shinoda ...................... 359/627 |

FOREIGN PATENT DOCUMENTS

| JP | 11-145033 | 5/1999 |
| JP | 2000-077315 | 3/2000 |
| JP | 2001-264696 | 9/2001 |

* cited by examiner

*Primary Examiner*—Alan Mathews
(74) *Attorney, Agent, or Firm*—Morgan & Finnegan, L.L.P.

(57) ABSTRACT

There is provided a correction apparatus for correcting a shift between optical axes in two separate optical units adapted such that a beam emitted from one unit enters the other, including a converter for converting a positional shift between the optical axes into an angular shift, and an angular corrector for correcting the angular shift.

13 Claims, 11 Drawing Sheets

CORRECTION APPARATUS THAT CORRECTS OPTICAL SHIFT IN TWO OPTICAL UNITS, AND EXPOSURE APPARATUS HAVING THE SAME

BACKGROUND OF THE INVENTION

The present invention relates generally to exposure apparatuses, and more particularly to illumination and exposure apparatuses used to expose an object to be exposed, such as a single crystal substrate for a semiconductor wafer, and a glass substrate for a liquid crystal display (LCD), a device fabricating method using the exposed object, and a device fabricated from the exposed object. The present invention is suitably applicable, for example, to step-and-scan, scanning, or step-and-repeat exposure apparatuses which expose a single crystal substrate for a semiconductor wafer in a photolithography process.

The "step-and-scan" manner, as used herein, is one mode of exposure method which exposes a mask pattern onto a wafer by continuously scanning the wafer relative to the mask or reticle (hereinafter, these terms are used interchangeably in this application), and by moving, after a shot of exposure, the wafer stepwise to the next exposure area to be shot. The "scanning" manner is another mode of exposure method which uses a projection optical system to project part of a mask pattern onto a wafer, and exposes the entire mask pattern to the wafer by synchronously scanning the mask and wafer relative to the projection optical system. The "step-and-repeat" manner is still another mode of exposure method which moves a wafer stepwise to an exposure area for the next shot every shot of cell projection onto the wafer.

Along with the recent demand on smaller and thinner profile electronic devices, minute semiconductor devices to be mounted onto these electronic devices have been increasingly demanded. For example, a design rule for a mask pattern tries to achieve a line and space (L&S) of 130 nm on a mass production line, and predictably it will be increasingly smaller in the future. L&S denotes an image projected to a wafer in exposure with equal line and space widths, and serves as an index of exposure resolution. The exposure has three important factors—resolution, overlay accuracy, and throughput. The resolution is the minimum size for a precise pattern transfer. The overlay accuracy is a precision with which to overlay multiple patterns over an object to be exposed. The throughput is the number of sheets exposed per unit of time.

Basically, there are two exposure methods—a full-size transfer method and a projection method. The full-size transfer includes a contact method that brings a mask into close contact with an object to be exposed, and a proximity method that slightly spaces them from each other. Although the contact method may provide the high resolution, dusts and silicon fragments enters under the mask in a compressed state, causing the mask to be damaged as well as the exposed object to be flawed and defective. The proximity method ameliorates such problems, but still possibly damages the mask if a distance between the mask and the object to be exposed becomes shorter than the maximum size of a dust particle.

Accordingly, a projection method has been suggested which farther spaces the mask from the object to be exposed. Among projection modes, a scanning projection exposure apparatus has been the recent trend for the improved resolution and expanded exposure area, which exposes the entire mask pattern onto the wafer by projecting part of a mask, onto the wafer and synchronizingly scanning the mask and wafer with each other, continuously or intermittently.

In general, a projection exposure apparatus includes an illumination optical system that uses a beam or ray emitted from a light source to illuminate a mask, and a projection optical system that is located between the mask and the object to be exposed. In order to form a uniform illumination area, the illumination optical system introduces the beam from the light source to a light integrator, such as a fly-eye lens, which includes a plurality of rod lenses, and uses a condenser lens to Kohler-illuminate the mask surface with a plane of exit side of the light integrator as a secondary light source plane.

The following equation gives the resolution R of the projection exposure apparatus using a light-source wavelength λ and the numerical aperture of apertures (NA) of the projection optical system:

$$R = k_1 \times \frac{\lambda}{NA} \qquad (1)$$

Therefore, the shorter the wavelength becomes and the higher the NA increases, the better the resolution becomes.

In the meantime, a focusing range that maintains desired image-forming performance is called a depth of focus (DOF), and the DOF is given in the following equation:

$$DOF = k_2 \times \frac{\lambda}{NA^2} \qquad (2)$$

Therefore, the shorter the wavelength becomes and the higher the NA increases, the smaller the DOF becomes. The small DOF would make difficult the focus adjustment, as well as require the higher flatness for a substrate and the more precise focusing accuracy, and thus the large DOF is basically desirable.

It can be understood from these equations 1 and 2 that the shortened wavelength is more effective than the increased NA. Therefore, in recent years, a light source is in transition from the conventional ultrahigh pressure mercury lamp to short-wavelength KrF excimer laser (with a wavelength of approximately 248 nm) and ArF excimer laser (with a wavelength of approximately 193 nm). As the number of optical members that transmit light increases, the shortened wavelength of exposure light lowers the transmittance (and thus the luminous intensity at an image plane and throughput due to decreased power), and therefore, recent projection exposure apparatuses attempt to use a smaller number of optical members for high transmittance. In addition, when a comparatively small ultrahigh pressure mercury lamp is used as a light source, a projection exposure apparatus usually can mount the light source in the apparatus body. On the contrary, when a comparatively bulk excimer laser is used as a light source, the projection exposure apparatus cannot mount the light source in the apparatus body, and the light source has to be separated from the apparatus body (for example, such that the apparatus body is located on a second floor and the light source unit is located on the first floor).

Such a conventional configuration that separates the apparatus body from the light source unit has a problem in that optical axes shift due to different installation environments between the apparatus and the light source unit, lowering the resolution for the exposure. For example, when these apparatus and unit are located on different floors, the different installation environments (such as vibration frequency and phase on each floor) would easily result in discordant optical axes and the fluctuant and uneven luminous intensity at the time of exposure, lowering the resolution. This is because the beam incident upon the illumination optical system that has a shifted optical axis causes the vignetting as well as fluctuant luminous intensity, and a beam that asymmetrically enters the illumination optical system causes the uneven luminous intensity. The fluctuant and uneven luminous intensity hamper control of the exposure amount to the desired amount at the time of exposure, thereby deteriorating the resolution. In particular, in light of the recent demand on the minute pattern, it is expected that even a slight degradation in resolution cannot be neglected in the future.

In order to solve these problems, Japanese Laid-Open Patent Applications Nos. 11-145033 and 2000-77315 propose means for correcting an optical axis in real time. Both references propose to correct an angular shift in the optical axis by pivoting a mirror, and a positional shift in the optical axis by tilting a parallel plate of a specified refractive index. Although the rotation of the mirror attains sufficiently responsive correction, the plane parallel plate undesirably lowers the transmittance and thereby throughput. On the other hand, it is conceivable to correct a positional shift in the optical axis by moving the mirror in parallel, but it is difficult to quickly move the mirror in parallel while keeping the mirror angle, disadvantageously resulting in poorly responsive correction.

BRIEF SUMMARY OF THE INVENTION

Accordingly, it is an exemplified general object of the present invention to provide a novel and useful correction apparatus, exposure apparatus, device fabricating method, and device, in which the above disadvantages are eliminated.

More specifically, an exemplified object of the present invention is to provide a correction apparatus which corrects shifts in optical axes with good responsiveness but without deteriorating the transmittance from a light source (i.e., while keeping the desired throughput), an exposure apparatus and device fabricating method which use the correction apparatus to enhance the performance. Of course, the present invention cover those devices, such as high quality semiconductors, LCDs, CCDs, and thin film magnetic heads, which are manufactured by the device fabricating method.

In order to achieve the above object, a correction apparatus according to one aspect of the present invention, which corrects a shift between optical axes in two separate optical units adapted such that a beam emitted from one unit enters the other includes a converter for converting a positional shift between the optical axes into an angular shift, and an angular corrector for correcting the angular shift. According to such a correction apparatus, the converter converts the positional shift into the angular shift, and eliminates the need to correct the positional shift between the optical axes, for example, by moving a reflective point in parallel.

The present invention is applicable to two optical units that are not separated, and in this case a shift between optical may be broadly extended to a shift between optical paths or beam positions. For example, the present invention is applicable to two optical units located in the same room, one of which is a laser source, so as to correct a shift between optical paths or beam positions when the laser source vibrates.

A correction apparatus according to another aspect of the present invention, which corrects a shift between optical axes in two separate optical units adapted such that a beam emitted from one unit enters the other includes a first angular corrector for correcting an angular shift between the optical axes, a converter for converting a positional shift between the optical axes into an angular shift, and a second angular corrector for correcting the converted angular shift. This correction apparatus also uses the converter to convert the positional shift into the angular shift, eliminating the need to correct the positional shift between the optical axes by using the refraction or by moving a reflective point in parallel.

At least one of the first and second angular correctors includes a reflective mirror, and a tilting mechanism for tilting the reflective mirror with respect to one of the optical axes. Such a structure has a good responsiveness and few losses at the time of correction. The reflective mirror may be replaced with an optical member using total reflection utilizing a difference between refractive indexes. This is because it is difficult to design of a reflective film having high reflectance for use in a short wavelength range since only limited types of materials are available to form such a reflective film, and the total reflection utilizing a difference between refractive indexes of the optical member and air possibly provides higher reflectance.

A correction apparatus may further include a first detector for detecting the angular shift between the optical axes, a second detector for detecting the converted angular shift corresponding to the positional shift between the optical axes, and a controller, connected to the first and second detectors, which controls the first and second angular correctors based on detection results from the first and second detectors. According to this correction apparatus, the controller may control the optical axis with high precision in accordance with the detection results by detectors. At least one of the first and second angular correctors may include a reflective mirror, and a drive unit for driving the reflective mirror so that the reflective mirror may tilt with respect to one of the optical axes, wherein the controller controls the drive unit. As described above, such a structure is highly responsive with few losses at the time of correction.

According to still another aspect of the present invention, there is provided an exposure apparatus including one of above correction units, and an optical system which projects a pattern formed on a reticle or mask onto an object to be exposed. Such an exposure apparatus also performs operations similar to the above exposure apparatuses.

According to yet another aspect of the present invention, there is provided a device fabricating method comprising the steps of exposing an object to be exposed using the above exposure apparatus, and performing a predetermined process for the exposed object. Claims for a device fabricating method for performing operations similar to that of the above exposure apparatus cover devices as intermediate and final products. Such devices include semiconductor chips like an LSI and VLSI, CCDs, LCDs, magnetic sensors such as, thin film magnetic heads, or the like.

Other objects and further features of the present invention will become readily apparent from the following description of the preferred embodiments with reference to accompanying drawings.

DETAILED DESCRIPTION OF THE PREFERRED EMBODIMENTS

Figure 1:
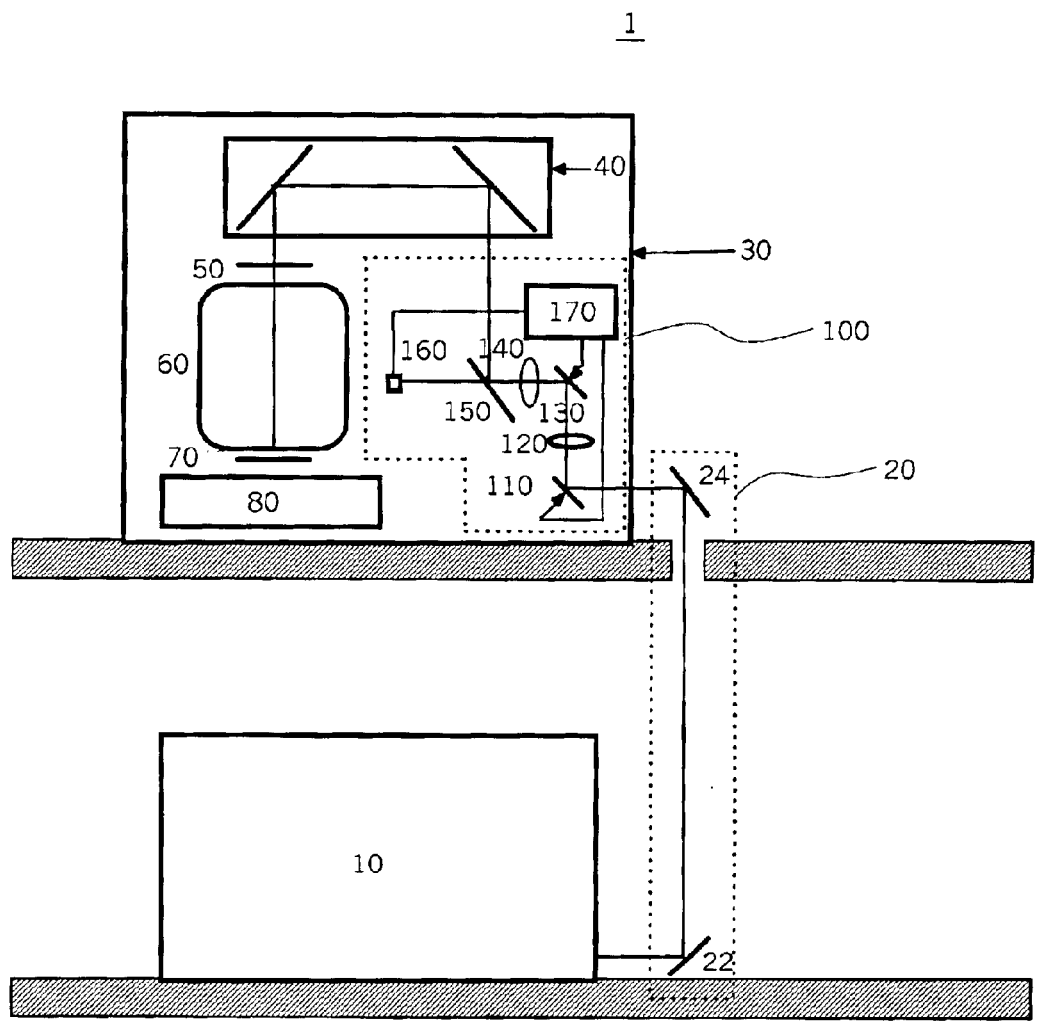
FIG. 1 is a simplified optical path for an exemplary exposure apparatus of the present invention.

A description will now be given of an exemplary exposure apparatus 1 of the present invention by referring to the accompanying drawings. Here, FIG. 1 is a view of a simplified optical path for the exposure apparatus 1. As shown in FIG. 1, the exposure apparatus 1 includes a light source unit 10, and an apparatus body 30 separated from the light source unit 10. The light source unit 10 and the apparatus body 30 are connected by an optical system 20 that leads a beam from the light source unit 10 to the apparatus body 30. However, the present invention does not necessarily require the optical system 20, and a beam from the light source unit 10 may directly enter the apparatus body 30 without any intervening optical system. The apparatus body 30 houses an illumination optical system 40, a reticle 50, a projection optical system 60, a plate 70, a stage 80, and a correction apparatus 100. As shown in FIG. 1, the exposure apparatus 1 is a scanning projection exposure apparatus which exposes a circuit pattern formed on the reticle 50 onto the plate 70 in a step-and-repeat or step-and-scan manner. FIG. 1 shows that the light source unit 10 and apparatus body 30 are located on different floors. However, the present invention does not necessarily require that both be located on different floors as far as the exposure apparatus 1 is divided into two different and separate optical systems (i.e., the light source unit 10 and the apparatus body 30 in the present embodiment).

The light source unit 10 in the present embodiment uses as a light source an excimer laser (such as ArF excimer laser with a wavelength of approximately 193 nm, KrF excimer laser with a wavelength of approx. 248 nm, and $F_2$ excimer laser with a wavelength of approx. 153 nm). However, the present invention does not limit a type of laser to excimer laser but thus may use YAG laser, for example. Also, it does not limit the number of laser units. When the light source unit 10 uses laser, it is desirable to employ a beam shaping optical system that shapes a parallel beam from a laser source to a desired beam shape, and an incoherently turning optical system that turns a coherent laser beam into an incoherent one. An excimer laser unit is so comparatively bulk that it is attached as a separate unit from the apparatus body 30, although the present invention does not address a size of the light source unit 10 and is widely applicable to exposure apparatuses that are divided into multiple parts. Therefore, a light source applicable to the light source unit 10 is not limited to laser, and may use one or more lamps such as a mercury lamp and a xenon lamp. The light source unit 10 and apparatus body 30 are isolated, and thus have different installation environments (in vibration frequency and phase on each floor).

The optical system 20 includes mirrors 22 and 24 in the present embodiment, and serves as a system that guides a beam emitted from the light source unit 10 to the apparatus body 30. The guide system may include a lens, etc. The present invention may remove the optical system 20 such that a beam from the light source unit 10 may directly enter the apparatus body 30.

As stated above, the apparatus body 30 includes the illumination optical system 40, the reticle 50, the projection optical system 60, the plate 70, the stage 80, and the correction apparatus 100.

The illumination optical system 40 is an optical system that illuminates the reticle 50, and includes a lens, a mirror, a light integrator, a stop, and the like, for example, in the order of a condenser lens, a fly-eye lens, an aperture stop, a condenser lens, a slit, and an image-forming optical system. The illumination optical system 40 can use any light whether it is axial or non-axial light. The light integrator may include a fly-eye lens or an integrator formed by stacking two sets of cylindrical lens array plates (or lenticular lenses), and be replaced with an optical rod or a diffractive element.

The exposure apparatus 1 is particularly effective when only one fly-eye lens is used (in other words, when only one fly-eye lens for Kohler-illuminating the mask 50 is provided and no other fly-eye lens for uniformly illuminating the former fly-eye is provided). This is because in such a case, if light that is about to enter the former fly-eye lens vibrates and shifts laterally, the light incident upon the former fly-eye lens fails to be parallel to the optical axis, thus causing a non-telecentric state as if illuminating the mask 50 askew. As a result, the illumination of the wafer becomes non-telecentric, and thereby an image shifts as the wafer moves in a DOF direction. On the contrary, the additional fly-eye lens would when provided absorb the influential lateral shift of the light incident upon the former fly-eye lens, achieving a correction effect similar to that of the exposure apparatus 1.

A reticle 50, on which a circuit pattern (or an image) to be transferred is formed, is made, for example, of quartz and supported by a reticle stage (not shown). Diffracted light from the reticle 50 is projected onto the plate 70 through the projection optical system 60. The plate 70 is an object to be exposed such as a wafer or a liquid crystal substrate, onto which resist is applied. The reticle 50 and plate 70 are located in a conjugate relationship. When the exposure apparatus 1 is a scanning projection exposure apparatus, it transfers a pattern on the reticle 50 onto the plate 70 by scanning the reticle 50 and plate 70. When the exposure apparatus 1 is a stepper (or a step-and-repeat exposure apparatus), it exposes while resting the reticle 50 and plate 70.

The projection optical system 60 can use an optical system consisting of a plurality of lens units, an (catadioptric) optical system comprising a plurality of lens units and at least one concave mirror, an optical system comprising a plurality of lens units and at least one diffractive optical element such as a kinoform, a full mirror type optical system, and so on. Any necessary correction of the chromatic aberration may use a plurality of lens units made from glass materials having different dispersion values (Abbe values), or arranges a diffractive optical element such that it disperses in a direction opposite to that of the lens unit.

Photoresist is applied onto the plate 70. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The stage 80 supports the plate 70. The stage 80 may use any structure known in the art, and thus a detailed description of its structure and operations is omitted here. For example, the stage 80 can use a linear motor to move the plate 70 in X-Y directions. The reticle 50 and plate 70 are scanned synchronously, and positions of the stage 80 and reticle stage (not shown) are monitored, for example, by laser interferometer and the like so that both are driven at a constant speed ratio.

Figure 2:
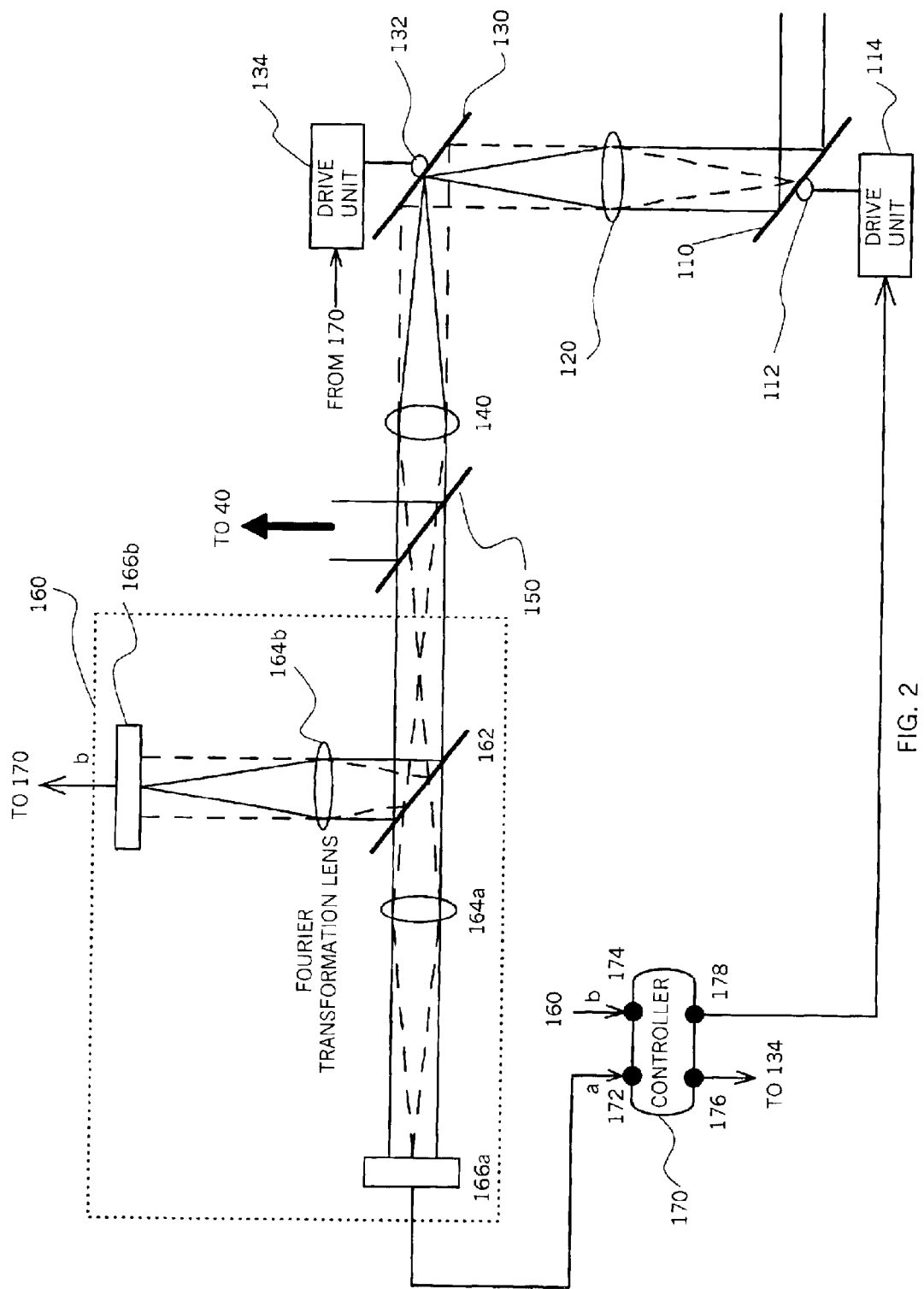
FIG. 2 is a more detailed block diagram of a correction apparatus in the exposure apparatus shown in FIG. 1.

The correction apparatus 100, which are shown in FIG. 2 in detail, corrects a shift of the optical axes in two optical units, i.e., the light source unit 10 and apparatus body 30. Here, FIG. 2 is a more detailed block diagram of the correction apparatus 100 shown in FIG. 1. A shift between optical axes covers angular and positional shifts between the optical axes in the present embodiment. The correction apparatus 100 comprises mirrors 110 and 130, tilting members 112 and 132, drive units 114 and 134, a Fourier transformation lens 120, a reverse Fourier transformation lens 140, a half mirror 150, a detection optical system 160 and a controller 170.

The mirror 110 is a mirror that corrects an angular shift between the optical axes by altering an angle formed between the optical axis and the mirror. The tilting member 112 is coupled with the mirror 110 to alter the angle formed between the mirror and the optical axis. Although the instant embodiment describes an angle around one axis perpendicular to a sheet of FIG. 2 for illustration purpose, it is of course extendable to two-dimensional angular changes. The tilting member 112 is composed, for example, of a shaft connected to the mirror 110 perpendicular to the sheet of FIG. 2, and a gear fitted into the shaft. The tilting member 112 is connected to and driven by the drive unit 114. The drive unit 114 is composed, for example, of a motor, and a gear that is fitted into a motor shaft of the motor and the gear of the tilting member 112. As a result, with controlled power supply to the motor in the drive unit 114, the rotation of the motor shaft transmits to the shaft in the tilting member 112 and rotates the mirror 110, changing the angle formed between the optical axis and the mirror 110. An alternative driving method would dispose a piezoelectric element behind the mirror 110 and use it as a drive source.

The Fourier transformation lens 120 is a lens that positions the mirror 110 and mirror 130 in a relationship of an image and a pupil. As a result, a positional distribution at a position of the mirror 110 is converted into an angle distribution at a position of the mirror 130, and an angular distribution at the position of the mirror 110 is converted into a positional distribution at the position of the mirror 130.

The mirror 130 is a mirror that corrects a positional shift between the optical axes by altering the angle formed by the optical axis and the mirror. The tilting member 132 is coupled with the mirror 130 to change the angle between the mirror 130 and the optical axis. Although the instant embodiment describes an angle around one axis perpendicular to a sheet of FIG. 2 for illustration purpose, it is of course extendable to two-dimensional angular changes. The tilting member 132 is composed, for example, of a shaft connected to the mirror 130 perpendicular to the sheet of FIG. 2, and a gear fitted into the shaft. The tilting member 132 is connected to and driven by the drive unit 134. The drive unit 134 is composed, for example, of a motor, and a gear that is fitted into a motor shaft of the motor and the gear of the tilting member 132. As a result, with controlled power supply to the motor in the drive unit 134, the rotation of the motor shaft transmits to the shaft in the tilting member 132 and rotates the mirror 130, changing the angle formed between the optical axis and the mirror 130. An alternative driving method would dispose a piezoelectric element behind the mirror 130 and use it as a drive source.

It is possible to use an optical member that realizes the total reflection utilizing a difference between refractive indexes, for the mirrors 110 and 130. A description will now be given of such an optical member.

Figure 8A:
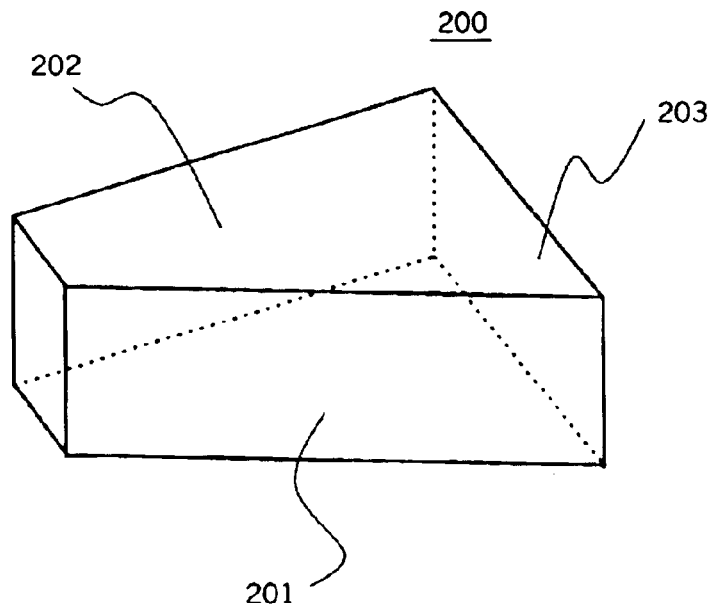
FIG. 8A is a schematic perspective view of an inner-surface reflection type optical element as an alternative of the mirror in the correction apparatus shown in FIG. 1.

FIG. 8A is a schematic perspective view of an inner-surface reflection type optical element 200 as an alternative to the mirrors 110 and 130. The optical element 200 includes a glass material that has sufficient transmittance (more than 99.5%/cm) in the light with a wavelength of less than 200 nm. In the figure, 201 denotes a plane of incidence, 202 denotes a plane of reflection (or a plane of total reflection), and 203 denotes a plane of exit. Highly efficient deflection of light requires to reduce a loss of quantity of light to the utmost at each of the plane of incidence, plane of reflection, and plane of exit, in addition to use of a glass material of sufficiently high transmittance.

Figure 8B:
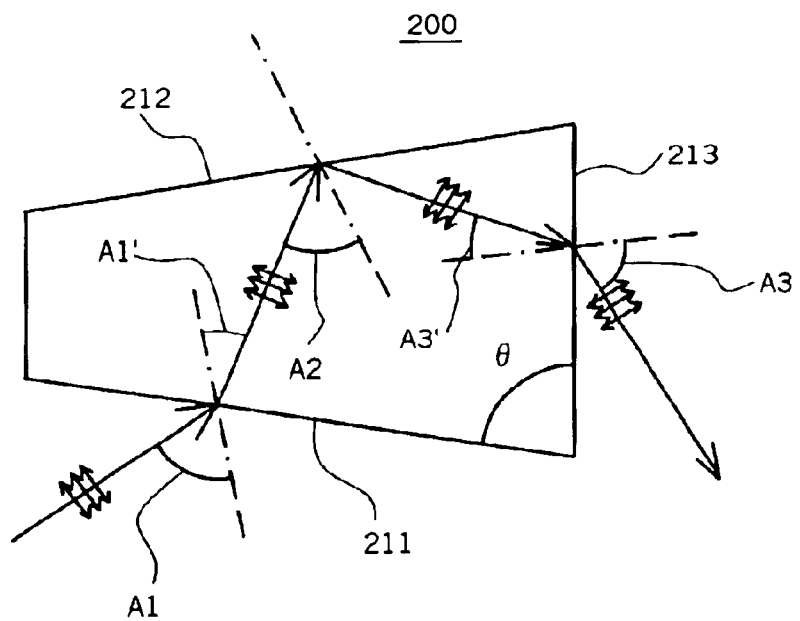
FIG. 8B is a plan view of the inner-surface reflection type optical element which shows details of conditions for highly efficient deflection of light.

FIG. 8B is a plan view of the inner-surface reflection type optical element 200 showing details of conditions for highly efficient deflection of light. A1, A2, and A3 denote angles incident upon the plane of incidence 201, plane of reflection 202, and plane of exit 203, respectively. A1' and A3' denote refractive angles at the plane of incidence 201 and plane of exit 203, respectively. It is assumed that the inner-surface reflection type optical element 200 is made of a fluorite ($CaF_2$) glass material with a refractive index of nc=1.5 for a wavelength of 193 nm, and surrounded by a sufficiently transmissive medium (with refractive index of ng=1) for a wavelength of 193 nm. Light of incidence is a parallel beam with a wavelength of 193 nm, and polarized light is in a linear polarization state.

Incidence upon the plane of incidence 201 without any loss of quantity of light requires a positional arrangement "for according a polarization direction of light of incidence with a direction within the plane of incidence (i.e., p (or parallel) polarization), and for satisfying the Brewster angle." Here, the Brewster angle (or a polarizing angle) is an angle where an angle of incidence $\Psi_{b1}$ of light from a material with a refractive index ng, which is incident upon a material with a refractive index nc, satisfies $\tan \Psi_{b1}$=nc/ng. $\Psi_{b1}$ becomes approximately 56.3° since $\tan \Psi_{b1}$=nc/ng=1.5 in this embodiment. Therefore, when the angle of incidence A1 is made to be $\Psi_{b1}$, the incident light of p polarization passes through the plane of incidence 201 with efficiency of approximately 100%, and then is led to the plane of reflection 202.

Reflection of light that has arrived at the plane of reflection 202 without any loss of quantity of light requires the plane of reflection to be arranged such that a condition of total reflection is met. In other words, it is sufficient that the angle of incidence A2 of the light that has arrived at the plane of reflection 202 meets a condition of "an angle larger than a critical angle but smaller than 90°". Here, the critical angle means the minimum angle of incidence $\Psi c$ that leads to the total reflection, and satisfies sin $\Psi c$=ng/nc when light from a material with a refractive index nc is incident to a material with a refractive index ng. In this embodiment, sin $\Psi c$=ng/cn=0.666 . . . and thus $\Psi c$ becomes approximately 41.8°. The total reflection when occurring under condition other than the critical angle would result in different amounts of phase jumps for p and s (or senkrecht) polarizations, but light arrives as the p polarization at the plane of exit 203 since only the p polarization component has a linear polarization in the present embodiment. Therefore, as long as the angle of incidence A2 upon the plane of reflection 202 is set 41.8°≦A2<90°, the light is reflected with efficiency of nearly 100% and led to the plane of exit 203.

Exit of light that has arrived at the plane of exit 202 without any loss of quantity of light requires, similar to the plane of incidence 201, a positional arrangement "for according the polarization direction with the p polarization and for satisfying the Brewster angle". In other words, tan $\Psi_{b3}$=ng/nc is to be set 0.66666, and thus Tan $\Psi_{b3}$ is approximately 33.7°. Therefore, when the angle of exit A3=$\Psi_{b3}$ is set to be 33.7° the reflected light of the p polarization component may pass through the plane of exit 203 with efficiency of nearly 100%.

From the above, when light is parallel light in a linear polarization state, a loss of quantity of light at each of the plane of refraction and the plane of reflection could be theoretically made zero, by using the inner-surface reflection type optical element 200 disposed so that "the plane of incidence and the plane of exit satisfy the Brewster angle and the plane of reflection satisfies the total reflection", whereby a loss of quantity of light may be reduced in the optical system using the inner-surface reflection type optical device 200. In other words, it is necessary to meet θ+2×A2=180° where θ is an angle between the plane of incidence 201 and the plane of exit 203 (and critical angle≦A2<90°), since A1=A3'=$\Psi_{b1}$ and A1'=A3=$\Psi_{b3}$.

Figure 9:
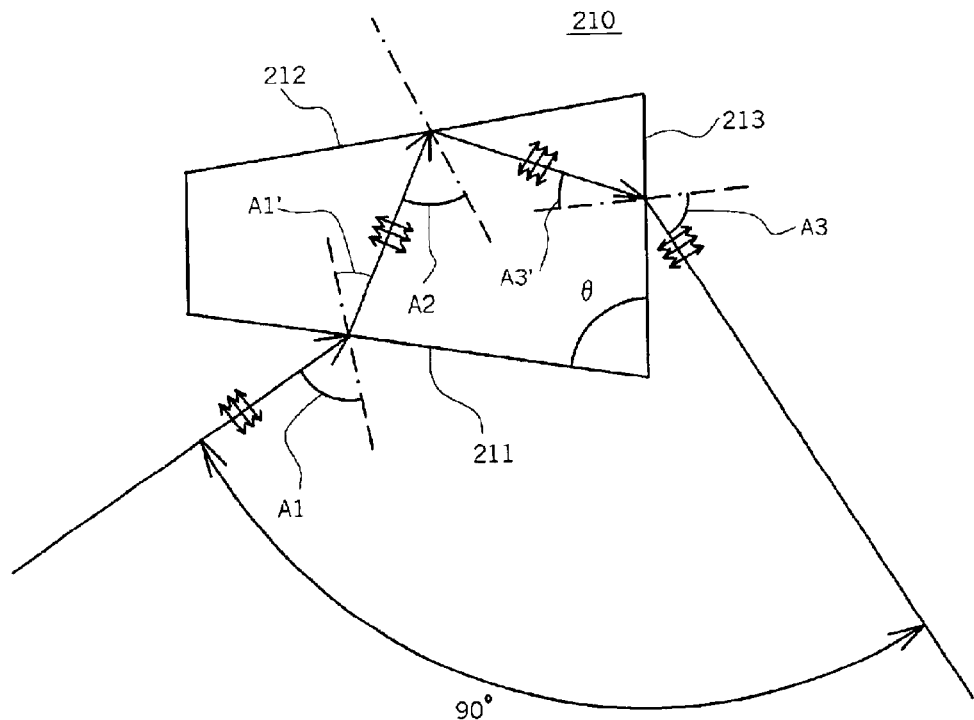
FIG. 9 is a plan view of a variation of the inner-surface reflection type optical element shown in FIG. 8.

Further, as shown in FIG. 9, it is desirable to use an optical element 210 with θ=90° for manufacture purposes, and light of exit may be polarized by 90° relative to light of incidence. At that time, the plane of reflection should be disposed so as to satisfy A2=45°. Here, Table 1 shows the polarization efficiency at boundaries (of incidence, reflection, and exit) for a beam having an open angle of 3° at one side of the angle of incidence, or when the angle of incidence A1 is 53.3°±3°.

TABLE 1 nc/ng = 1.5

| ANGLE OF INCIDENCE (A1) | RP/ SURFACE (%) | A3 | POLARIZATION EFFICIENCY (%) |
| --- | --- | --- | --- |
| 53.3° | 0.09 | 46.4° | 99.82 |
| 54.3° | 0.04 | 46.9° | 99.92 |
| 55.3° | 0.01 | 45.5° | 99.98 |
| 56.3° | 0 | 45.0° | 100.00 |
| 57.3° | 0.01 | 44.6° | 99.98 |
| 58.3° | 0.05 | 44.1° | 99.90 |
| 59.3° | 0.01 | 43.7° | 99.78 |

It is understood from Table 1 that when nc/ng=1.5, the reflection coefficient of p polarized light at a plane of incidence 211 becomes approximately 0.1%, 0.05%, and 0.01% for the open angle at one side of 3°, 2°, and 1°, respectively. This is true of the plane of exit 213. The angle of incidence A2 upon the plane of reflection 212 meets the condition of the total reflection. Therefore, as shown in Table 1, the polarization efficiency may be maintained approximately 99.8% for the open angle of 3°, and 99.9% or more for the open angle of 2° or less. However, strictly speaking, the transmittance depending upon a thickness of the glass material should be considered so as to determine the polarization efficiency. From the above, the inner-surface reflection type optical system 200 may effectively polarize a beam having up to an open angle of about 3° at one side in linear polarization.

Figure 10:
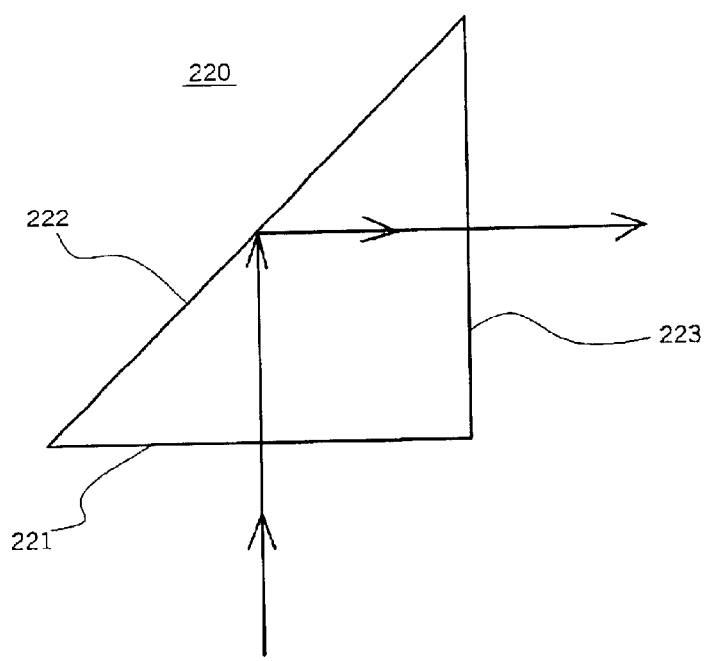
FIG. 10 is a plan view of a right-angled prism as another variation of the inner-surface reflection type optical element shown in FIG. 8.

FIG. 10 shows a right-angled prism, which deflects using the total reflection on the plane of reflection 222. This simple construction is desired for manufacture purposes, but requires an anti-reflective film onto each of planes of incidence and exit 221 and 223. The anti-reflective film eliminates a specific requirement to limit the light of incidence to a linear polarization state, while a light utilization coefficient of the prism depends on the efficiency of the anti-reflective film.

Figure 11:
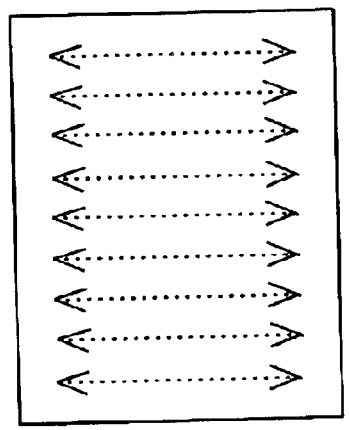
FIG. 11 is a figure showing a beam profile and polarized light of ArF excimer laser beam.

In using ArF excimer laser beam with a wavelength of 193 nm, its bandwidth is made narrow to reduce the problematic chromatic aberration in the projection optical system in the exposure apparatus, while its degree of polarization is set a nearly linear polarization state over 95%. In addition, it is an approximately parallel beam with an open angle of 1° or less at one side. FIG. 11 shows the profile and polarization state of this beam.

Efficiency is calculated by using inner-surface reflection type optical element 210 to deflect ArF excimer laser. When a linear polarization component of 95% is incident as the p polarization upon the plane of incidence 211, the p component beam passes through the plane of incidence with efficiency of 100% but 14.8% of a little existing s component beam is reflected. The transmittance becomes 99.26% from (95%×1)+(5%×0.852)=99.26%. The similar reduction also occurs at the plane of exit 213 and thus the polarization efficiency of the inner-surface reflection type optical element 210 becomes lowered up to 98.5%.

Figure 12:
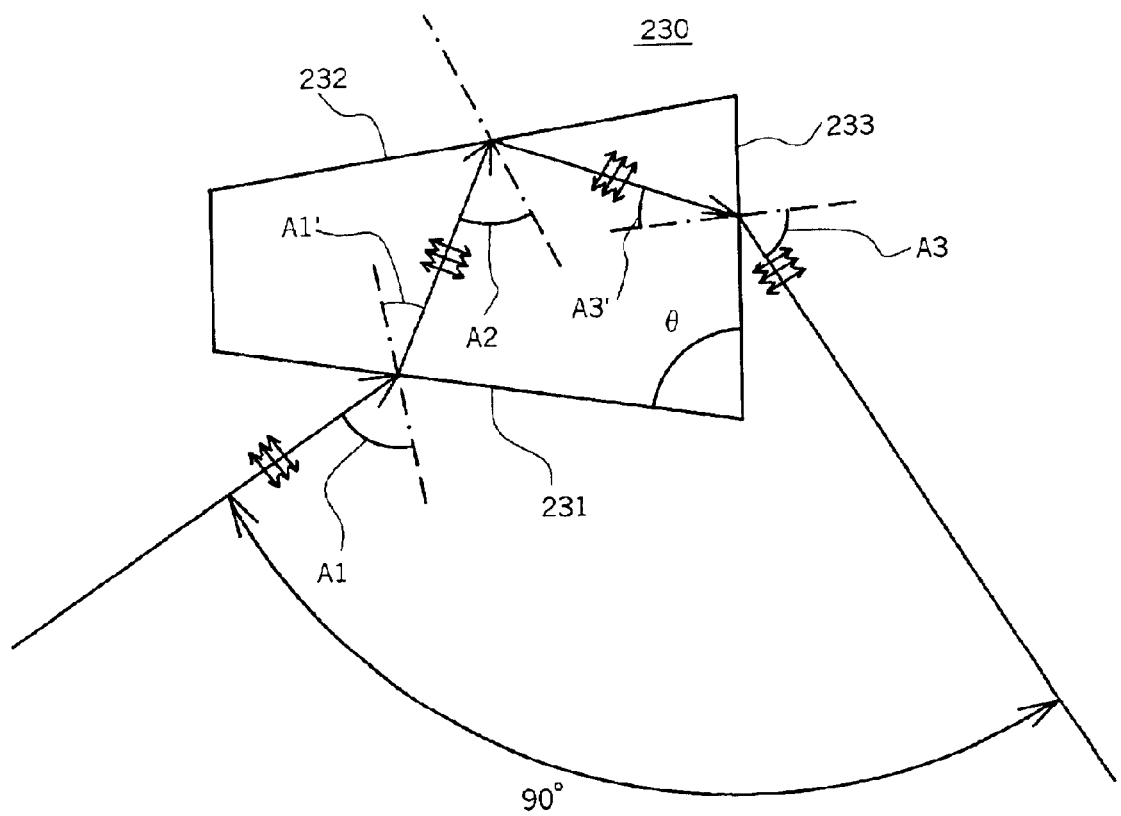
FIG. 12 is a plan view of another variation of the inner-surface reflection type optical element shown in FIG. 8.

A discussion will now be given of a method for improving the polarization efficiency using nearly linear polarization light such as ArF excimer laser beam. FIG. 12 is a plan view of an inner-surface reflection type optical element 230 as still another variation of the inner-surface reflection type optical element 200. The inner-surface reflection type optical element 230 is made of a fluorite (CaF$_2$) glass material with a refractive index of nc=1.5 and surrounded by a sufficiently transmissive medium (refractive index ng=1) with a wavelength of 193 nm. For transmittance improvement purposes, a plane of incidence 231 and a plane of exit 233 are given coating 234 (not shown) which, for example, uses a material with a refractive index n=1.4, and its angle of incidence A1 is set according to the condition of the coating 234. This is because, when a refractive surface in the plane of incidence etc. is coated, a refractive index at each boundary in a coat layer is determined by a sin function, causing an error because Brewster's condition is determined by a tan function, and deteriorating the transmittance. In other words, it is necessary to set an angle of incidence such that the transmittance may become optimal according to the refractive index and thickness of the material to be coated.

Table 2 shows the polarization efficiency for the angle of incidence A1 and reflectance (Rs, Rp) at the plane of incidence at boundaries (of incidence, reflection, and exit), where a fluorite glass material is coated by a thickness of 55 mm with a material having a refractive index n=1.4.

TABLE 2

SUBSTRATE (n = 1.5)
COAT (n = 1.4, THICKNESS: 55 nm)
NEARLY LENEAR POLARIZATION:
(P COMPONENT = 95% AND S COMPONENT = 5%)

| ANGLE OF INCIDENCE (A1) | Rs/ SURFACE (%) | Rs/ SURFACE (%) | POLARIZATION EFFICIENCY (%) |
| --- | --- | --- | --- |
| 48° | 5.54 | 0.08 | 99.65 |
| 49° | 5.83 | 0.05 | 99.66 |
| 50° | 6.14 | 0.02 | 99.67 |
| 51° | 5.47 | 0.01 | 99.67 |
| 52° | 5.83 | 0 | 99.66 |

It will be understood from Table 2 that coating results in the transmittance of 99.65% per one refractive surface for an angle of incidence A1 of 48°–52°, and enhances the refractive index of the inner-surface reflection type optical element 230 up to 99.3%.

Thus, for a nearly linear polarization with an open angle at one side of 2° or less and a degree of polarization of approximately 95%, the high polarization efficiency can be obtained by coating the refractive surface and providing the optimal angle of incidence.

On the other hand, it is desirable for a deliquescent glass material, such as fluorite, to coat its surface even for an additional purpose to provide a protective film. Coat on a refractive surface can be substituted by the conditions shown in Table 2. The coat on the reflective surface preferably uses durable materials that achieve the total reflection, and more preferably diverts the coating material for the refractive surface.

Figure 13:
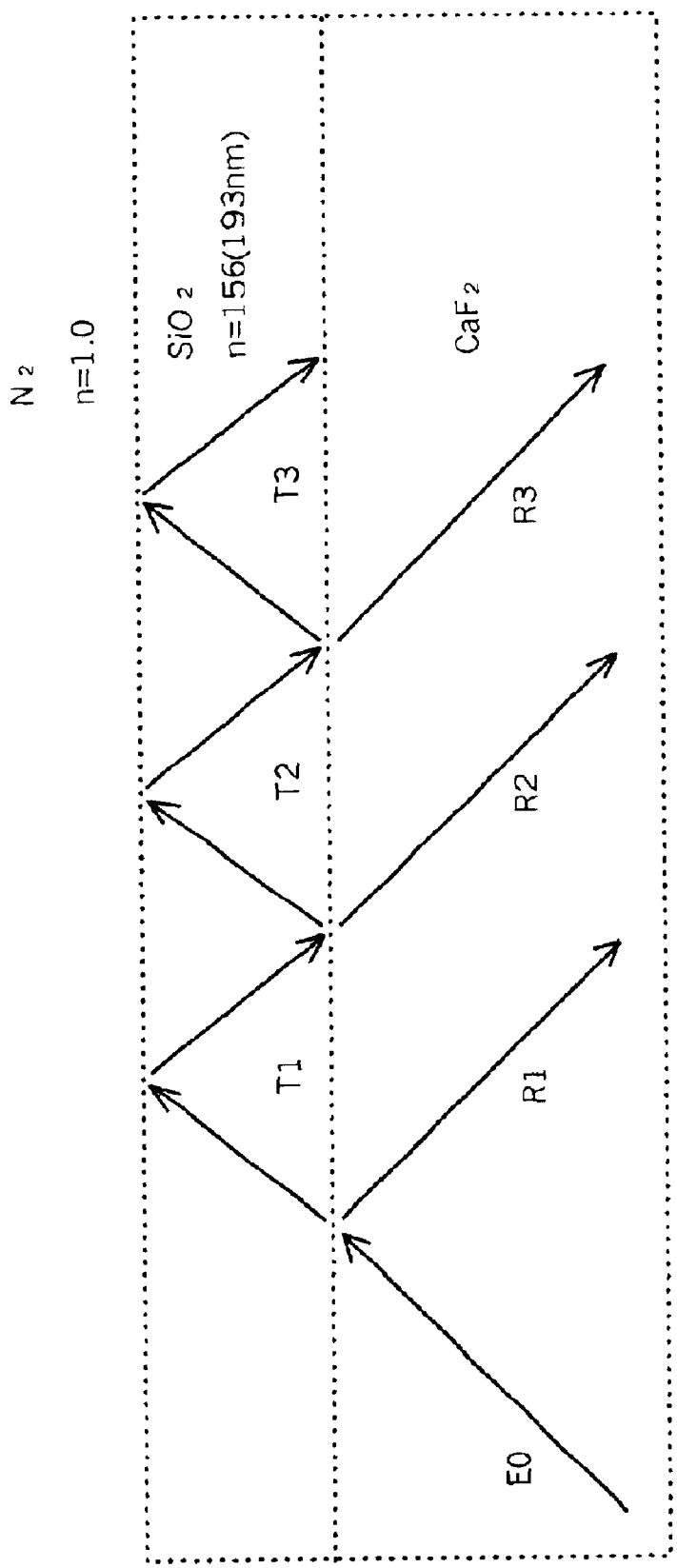
FIG. 13 is a view showing a $SiO_2$ coated reflective surface in the inner-surface reflection type optical element shown in FIG. 8.

FIG. 13 is a view showing the reflective surface 202 coated, for example, with $SiO_2$. E0 is light incident upon the reflection surface. A large portion (T1) in E0 transmits into the $SiO_2$ coat layer at a boundary between $CaF_2$ and $SiO_2$, although some portion (R1) is reflected. Transmitting light T1 is totally reflected at a boundary between $SiO_2$ and a medium (for example, a nitrogen atmosphere), and a large portion (R2) of T1 transmits to the boundary between $CaF_2$ and $SiO_2$, then returning to $CaF_2$. Some portion (T2) is reflected to the $SiO_2$ coat layer, then repeating the total reflection (at the boundary between $SiO_2$ and nitrogen) and the reflections and refractions (at the boundary between $CaF_2$ and $SiO_2$).

Accordingly, the light of incidence (E0) upon the total reflection surface and the light (R1+R2+ . . . ) reflected back to $CaF_2$ is identical so that there is not any loss of quantity of light during the deflection. Since a thickness of the $SiO_2$ coat layer is on the order of tens of nm, the transmittance loss on the $SiO_2$ coat layer is negligible. Although the above embodiment uses fluorite ($CaF_2$) as a glass material, other materials, such as composite quartz ($SiO_2$), $MgF_2$, and LiF, can also be used.

The anti-Fourier transformation lens 140 is used, but not necessarily, to simplify the following description.

The half mirror 150 reflects most of light while transmitting part of light: The light reflected by the half mirror 150 enters the illumination optical system 40 to become exposure light, while the light transmitted through the half mirror 150 enters the detection optical system 160 for detecting a shift between the optical axes.

The detection optical system 160 includes first and second detecting optical systems: The first detecting optical system includes a half mirror 162, an image-forming lens 164a, and a detector 166a; the second detecting optical system includes a half mirror 162, a Fourier transformation lens 164b, and a detector 166b. The transmittance and reflectance of the half mirror 162 are set to be nearly equal. The image-forming lens 164a disposes the mirror 110 and detector 166b in a nearly conjugate relationship. The Fourier transformation lens 164b disposes the mirror 110 and detector 166b in a relationship of an image and a pupil. Light incident upon the detector 166b may be light reflected from the half mirror 162 while light incident upon the detector 166b may be light transmitting through the half mirror 162.

This embodiment configures the detectors 166a and 166b using a charge coupled device (CCD), which can detect a positional distribution in an intensity-of-light distribution. However, these detectors 166a and 166b are not limited to a CCD, and may use a detector for detecting the intensity-of-light distribution, a quarterly split sensor, and a position sensor diode (PSD) capable of detecting a position of an incident beam.

The controller 170 controls the drive units 114 and 134 so as to remove positional and angular shifts between the optical axes based on the detection results from the detection optical system 160.

Figure 3:
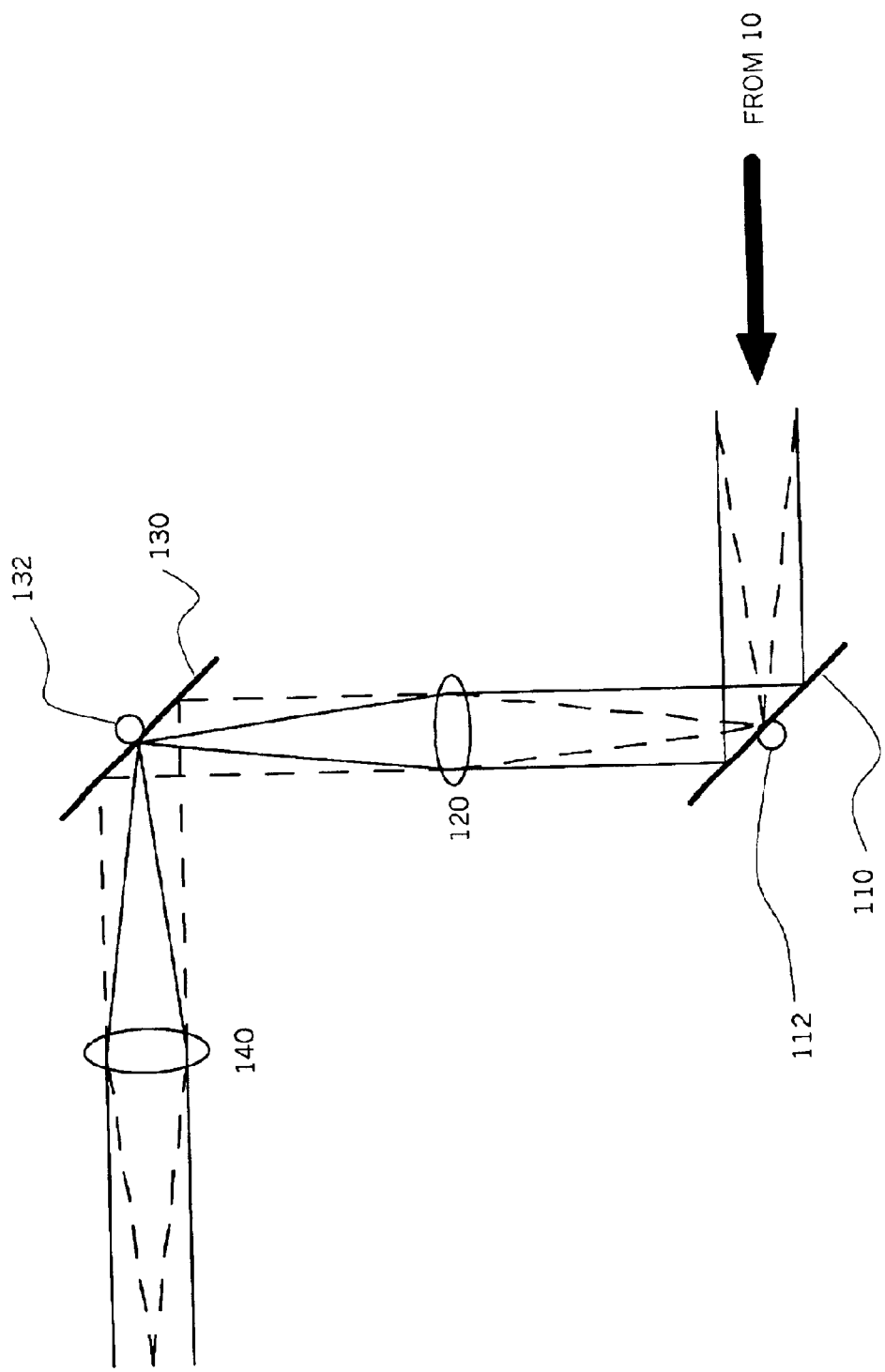
FIG. 3 is a view showing an optical relationship of a mirror of the correction apparatus shown in FIG. 2.
Figure 4:
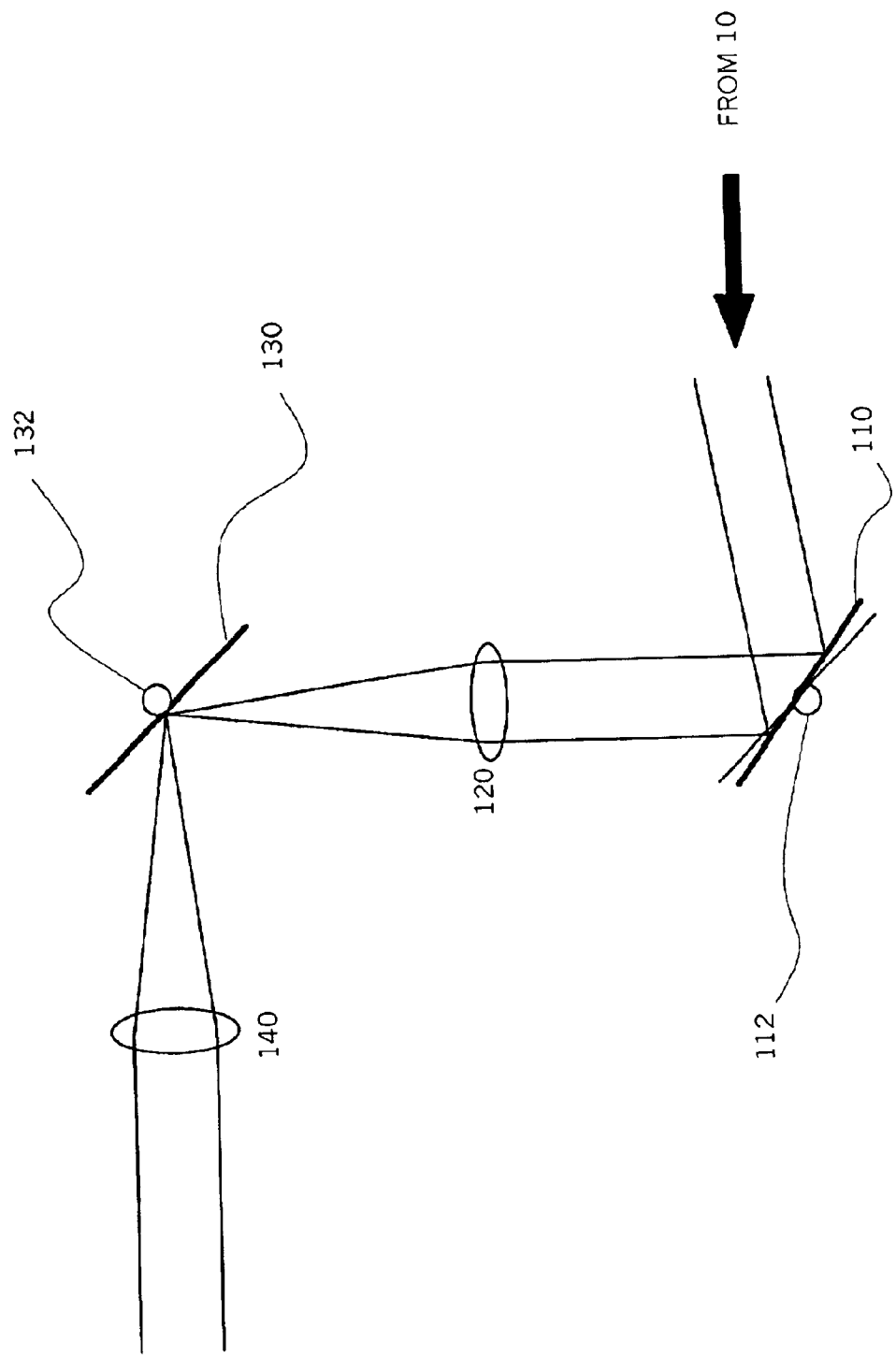
FIG. 4 is a view for explaining how the correction apparatus corrects an angular shift between optical axes.
Figure 5:
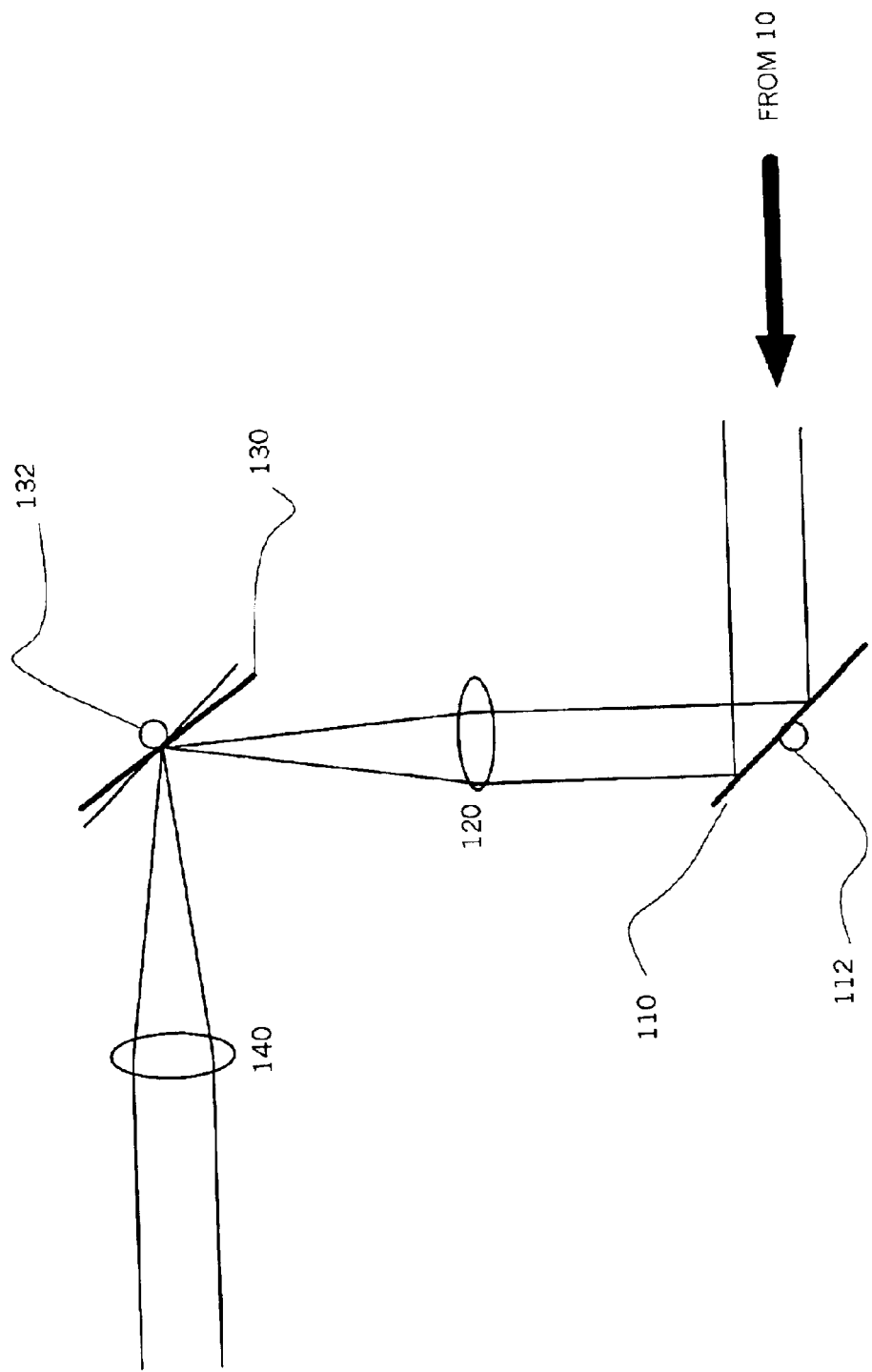
FIG. 5 is a figure explaining how the correction apparatus corrects a positional shift between the optical axes.

Referring to FIGS. 3–5, a description will now be given of operations of the correction apparatus 100. Here, FIG. 3 is a view that shows an optical relationship between the mirrors 110 and 130. FIG. 4 is a view for explaining how the correction apparatus 100 corrects an angular shift between the optical axes. FIG. 5 is a view for explaining how the correction apparatus 100 corrects a positional shift between the optical axes. As described above, the correction apparatus 100 in the present embodiment executes a one-dimensional correction, which is extendable to a two-dimensional correction since a shift between the optical axes shift usually occurs two-dimensionally.

A beam emitted from the light source unit 10 is guided by an optical system 20 to the correction apparatus 100 in the apparatus body 30. The different installation environments of the light source unit 10 and apparatus body 30 shift the optical axis of the light incident upon the apparatus body 30 from the optical axis in the optical system in the apparatus body 30, with respect to its angle and position.

The correction apparatus 100 disposes the mirror 130 at an image focal point of the Fourier transformation lens 120, and the mirror 110 at an object focal point of the lens 120. Straight lines in FIG. 3 denote that the Fourier transformation lens 120 condenses parallel light at the position of the mirror 110 onto the position of the mirror 130, whereas dotted lines in FIG. 3 denote that the Fourier transformation lens 120 turns light condensed at the position of the mirror 110 into parallel light at the position of the mirror 130. As a result, a positional shift at the position of the mirror 110 is converted into an angular shift at the mirror 130, while an angular shift at the mirror 110 is converted into a positional shift at the mirror 130.

In correcting an angular shift between the optical axes in the light source unit 10 and apparatus body 30, the mirror 110 is rotated from a thin line to a thick line as shown in FIG. 4 so that any angular shift included in the intensity-of-light distribution can be eliminated after the mirror 130. On the other hand, in correcting a positional shift between the optical axes in the light source unit 10 and apparatus body 30, the mirror 130 is rotated from a thin line to a thick line as shown in FIG. 5 so that any positional shift included in the intensity-of-light distribution can be eliminated after the mirror 130. In reality, the positional and angular between the optical axes take place at the same time, and therefore the mirrors 110 and 130 are driven in combination. According to the instant embodiment, a positional shift is converted to an angular shift and corrected by pivoting the mirror 130. The correction that rotates the mirror 130 about one shaft is easier and more responsive than that moving the mirror 130 in parallel. This is because the if correction by the parallel movement should maintain the mirror's parallelism during driving, and leads to a more complicated driving mechanism and worse responsiveness under large force of inertia unsuitable for quick acceleration and deceleration. On the contrary, the correction that rotates the mirror around one shaft would provide a simpler driving mechanism due to the rotation around the shaft, and high responsiveness since the entire mirror is not driven. Japanese Laid-Open Patent Applications Nos. 11-145033 and 2000-77315 using a plane parallel plate having a given refractive index require the plane parallel plate having a thickness of 122 mm for the maximum correction of ±15 mm, for example, where the plane parallel plate has the maximum tilt angle of 20° and a refractive index is 1.5. On the other hand, the transmittance of the optical unit becomes approximately 94% by raising 0.995 to $12.2^{nd}$ power for the transmittance of a glass material of 99.5%/cm. 94% is just for one unit, and will be reduced to 88.5% for two units necessary for the X-Y directions. In addition, the transmittance will be lower in two-dimensionally correcting a shift between the optical axes, since the transmittance of the optical unit needs to be multiplied by the transmittance of the anti-reflective film. On the other hand, according to the present embodiment, the only loss in efficiency is a reflective loss by the reflective film.

Turning back to FIG. 2, the beam incident upon the half mirror 150 is branched out by the half mirror 150: The reflected beam goes to the illumination optical system 40 while the light transmitting the half mirror 150 is incident upon the detection optical system 160. The beam incident upon the detection optical system 160 is first branched out by the half mirror 162 having nearly equal transmittance and reflectance. The transmitting light is incident upon the detector 166a arranged in an approximately conjugate relationship with the mirror 110 with respect to the image-forming lens 164a, while the reflected light goes into the detector 166b disposed in a relationship of an image and a pupil with the mirror 110 with respect to the Fourier transformation lens 164b. The detector 166a detects a positional distribution at the position of the mirror 110, while the detector 166b detects an angle distribution at the mirror 110. Therefore, according to the detection optical system 160 of the present embodiment, the controller 170 controls driving for the mirror 130 in accordance with the output from the detector 166a, and driving for the mirror 110 in accordance with the output from the detector 166b.

To be more concrete, based on each of an output a from the detector 166a and an output b from the detector 166b, the controller 170 first calculates a gravity position $(a_x, a_y)$ of a quantity-of-light distribution of the detector 166a and a gravity position $(b_x, b_y)$ of a quantity-of-light distribution of the detector 166b. The controller 170 then calculates shift amounts $(\Delta a_x, \Delta a_y)$ and $(\Delta b_x, \Delta b_y)$ from the reference positions $(a_0, a_0)$ and $(b_0, b_0)$ of each gravity position of the quantity-of-light distribution. The controller 170 then sends to the drive unit 114 a control signal $(\theta a_x, \theta a_y)$ based on $(\Delta a_x, \Delta a_y)$, which corresponds to a rotary angle for the mirror 130, and sends to the drive unit 134 a control signal $(\theta b_x, \theta b_y)$ based on $(\Delta b_x, \Delta b_y)$, which corresponds to a rotary angle for the mirror 130. There is a relationship between θa and Δa such that θa=Δa/fa where fa is a focal distance from 130 to the detector 166a in the optical system, while there is a relationship between θb and Δb such that θb=Δb/fb where fb is a focal distance from 110 to the detector 166b in the optical system. Controls by the controller 170 correct a shift between the optical axes (i.e., both angular and positional shifts) of the light reflected from the half mirror 150 to the illumination optical system 40.

A description will now be given of the operations of the exposure apparatus 1. During exposure, a beam emitted from the light source unit 10 enters the apparatus body 30, and then the correction apparatus 100 corrects a shift between the optical shafts. The corrected beam then enters the illumination optical system 40 through the half mirror 150. The beam incident upon the illumination optical system 40 provides the reticle 50, for example, with Kohler's illumination. The exposure apparatus 1 corrects a shift between the optical axe for the light incident upon the illumination optical system 40, and can provide a pattern transfer onto a resist with high precision, thus providing high quality devices (such as semiconductor devices, LCD devices, image pick-up devices (such as CCDs), thin film magnetic heads, or the like).

Figure 6:
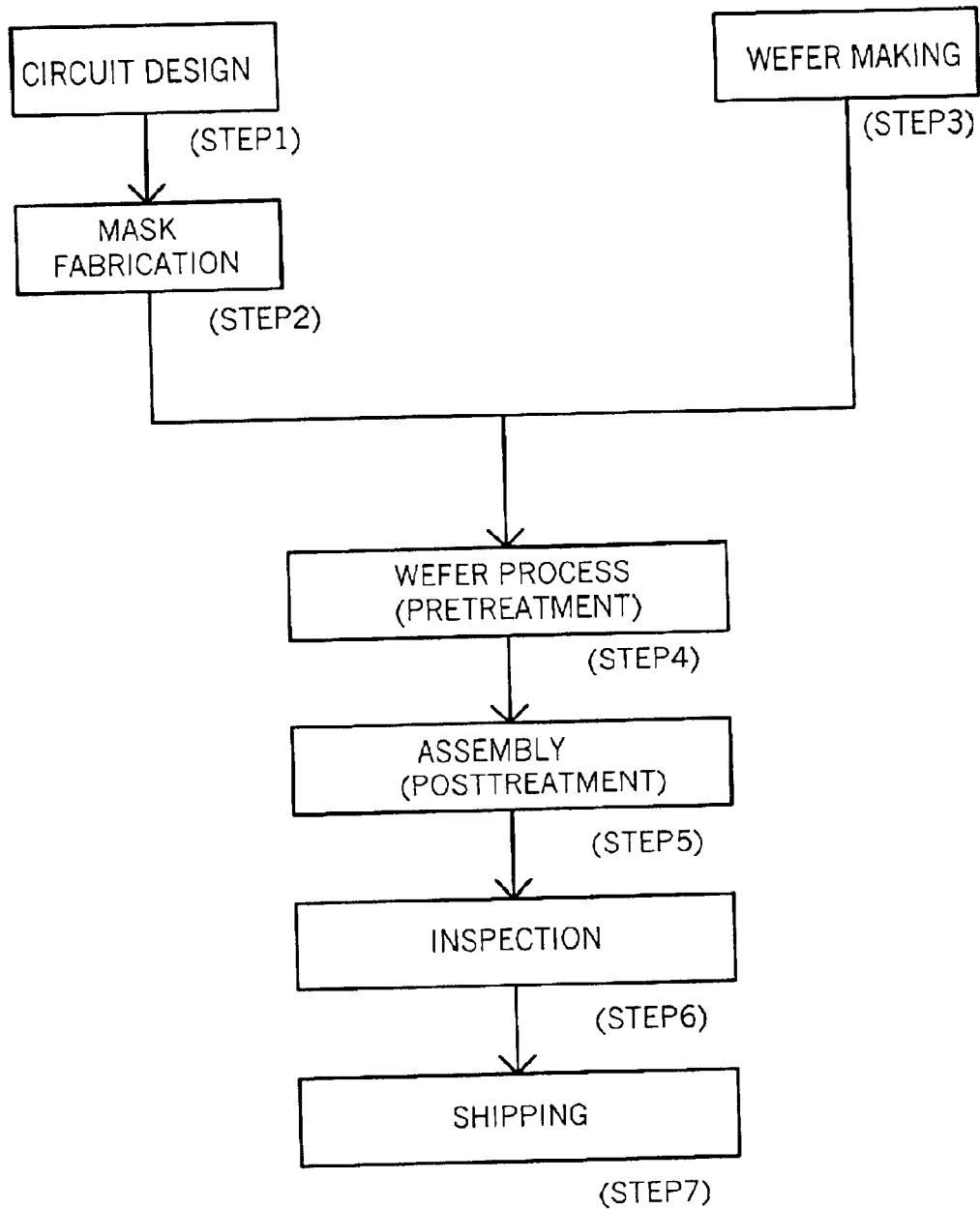
FIG. 6 is a flowchart for explaining a device fabricating method including the exposure steps of the present invention.
Figure 7:
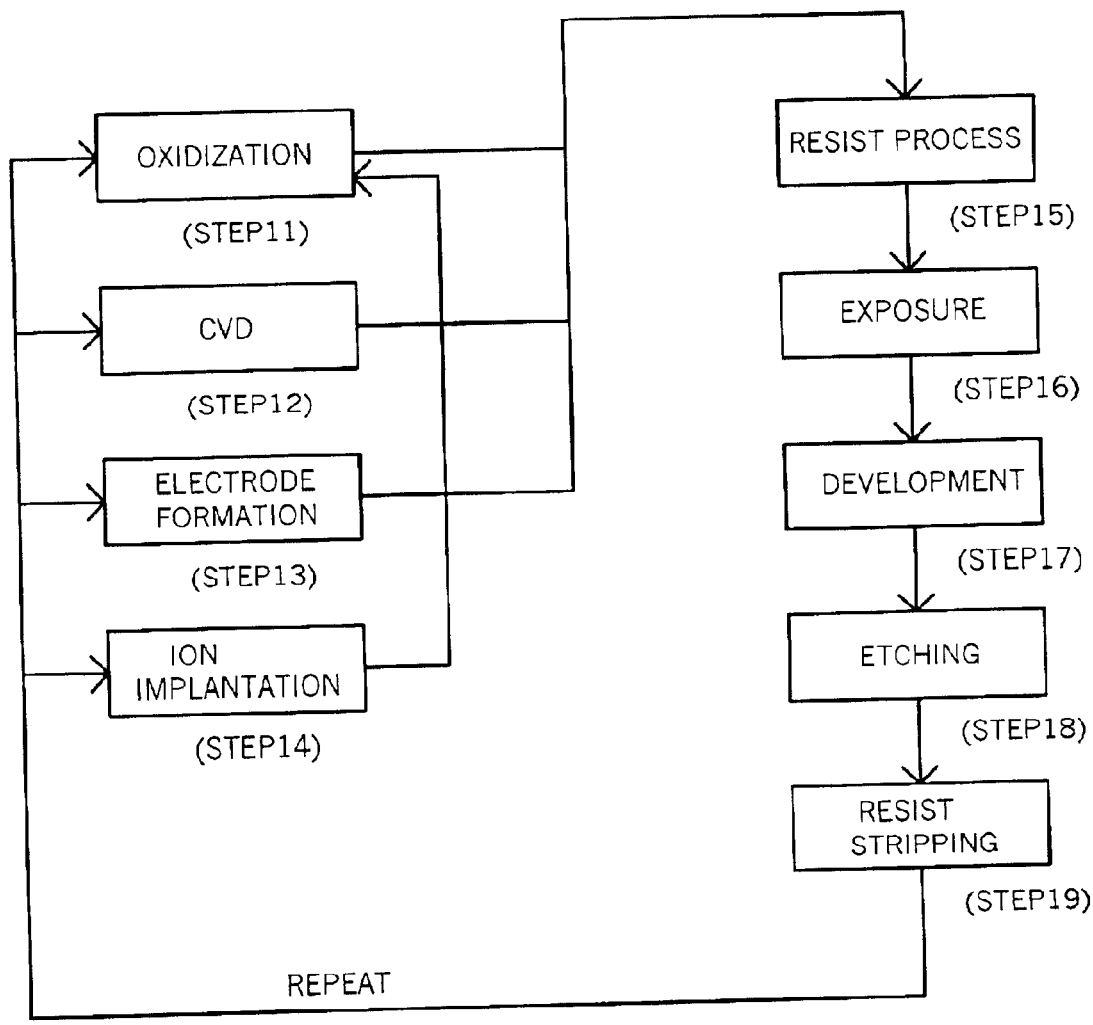
FIG. 7 is a detailed flowchart of step 4 shown in FIG. 6.

Referring to FIGS. 6 and 7, a description will now be given of an embodiment of device fabrication method using the above mentioned exposure apparatus 1. FIG. 6 is a flowchart for explaining a fabrication of devices (i.e., semiconductor chips such as IC and LSI, LCDs, CCDs). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography using the mask and wafer. Step 5 (assembly), which is also referred to as a posttreatment, forms into a semiconductor chip the ware formed in step 4 and includes a assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 7 is a detailed flowchart of the wafer process in Step 4. Step 11 (oxidation) oxidizes wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches part other than a developed resist image. Step 19 (resist stripping) removes disused resist after etching. These steps are repeated, and multi-layer circuit patterns are formed on the wafer. The fabrication method of the instant embodiment may manufacture higher quality devices than the prior art.

Further, the present invention is not limited to these preferred embodiments, and various variations and modifications may be made without departing from the spirit and scope of the present invention.

According to the correction and exposure apparatuses of the above embodiments, the converter converts a positional shift into an angular shift, and eliminates, for example, a need to correct a positional shift between the optical axes by a parallel movement of the reflective position. Therefore, these apparatuses have simpler structures, and correct a shift between the optical axes more quickly than the correction that uses the parallel movement of the reflective position with maintaining its angle. Also, the correction and exposure apparatuses of the above embodiments provides such a higher transmittance than a correction that uses a plane parallel plate with a given refractive index, that the desirable luminous intensity at the image plane and throughput can be derived. The device fabricating method uses the correction apparatus for a high exposure resolution, and provides such devices as high-quality semiconductors, LCDs, CCDs and thin film magnetic heads.

What is claimed is:

1. A correction apparatus for correcting a shift between optical axes in two separate optical units adapted such that a beam emitted from one unit enters the other, said correction apparatus comprising:
   a converter for converting a positional shift between the optical axes into an angular shift; and
   an angular corrector for correcting the angular shift.

2. A correction apparatus for correcting a shift between optical paths in two optical units adapted such that a beam emitted from one unit enters the other, said correction apparatus comprising:
   a converter for converting a shift between the optical paths into an angular shift; and
   an angular corrector for correcting the angular shift.

3. A correction apparatus for correcting a shift between optical axes in two separate optical units adapted such that a beam emitted from one unit enters the other, said correction apparatus comprising:
   a first angular corrector for correcting an angular shift between the optical axes;
   a converter for converting a positional shift between the optical axes into an angular shift; and
   a second angular corrector for correcting the converted angular shift.

4. A correction apparatus according to claim 3, wherein at least one of said first and second angular correctors comprises:
   a reflective mirror; and
   a tilting mechanism for tilting said reflective mirror with respect to one of said optical axes.

5. A correction apparatus for correcting a shift between optical axes in two separate optical units adapted such that a beam emitted from one unit enters the other, said correction apparatus comprising:
   a first angular corrector for correcting an angular shift between the optical axes;
   a converter for converting a positional shift between the optical axes into an angular shift;
   a second angular corrector for correcting the converted angular shift;
   an optical member using total reflection utilizing a difference between refractive indexes; and
   a tilting mechanism for tilting said optical member with respect to one of said optical axes.

6. A correction apparatus according to claim 3, further comprising:
   a first detector for detecting the angular shift between the optical axes;
   a second detector for detecting the converted angular shift corresponding to the positional shift between the optical axes; and
   a controller, connected to said first and second detectors, which controls said first and second angular correctors based on detection results from said first and second detectors.

7. A correction apparatus according to claim 6, wherein at least one of said first and second angular correctors comprises:
   a reflective mirror; and
   a drive unit for driving said reflective mirror so that said reflective mirror may tilt with respect to one of said optical axes,
   wherein said controller controls said drive unit.

8. An exposure apparatus comprising:
   a correction apparatus for correcting a shift between optical axes in two separate optical units adapted such that a beam emitted from a light source in one unit enters the other unit, said correction apparatus comprising a converter for converting a positional shift between the optical axes into an angular shift, and an angular corrector for correcting the angular shift; and
   an optical system in the other unit, that projects a pattern formed on a reticle or mask onto an object to be exposed with light from said light source.

9. An exposure apparatus comprising:
   a correction apparatus for correcting a shift between optical paths in two optical units adapted such that a beam emitted from a light source in one unit enters the other unit, said correction apparatus comprising a converter for converting a shift between the optical paths into an angular shift, and an angular corrector for correcting the angular shift; and
   an optical system in the other unit, that projects a pattern formed on a reticle or mask onto an object to be exposed with light from said light source.

10. An exposure apparatus comprising:
    a correction apparatus for correcting a shift between optical axes in two separate optical units adapted such that a beam emitted from a light source in one unit enters the other unit, said correction apparatus comprising a first angular corrector for correcting an angular shift between the optical axes, a converter for converting a positional shift between the optical axes into an angular shift, and a second angular corrector for correcting the converted angular shift; and
    an optical system in the other unit, that projects a pattern formed on a reticle or mask onto an object to be exposed with light from said light source.

11. A device fabricating method comprising the steps of:

exposing an object to be exposed using an exposure apparatus comprising a correction apparatus for correcting a shift between optical axes in two separate optical units adapted such that a beam emitted from one unit enters the other, said correction apparatus comprising a converter for converting a positional shift between the optical axes into an angular shift, and an angular corrector for correcting the angular shift, and an optical system for projecting a pattern formed on a reticle or mask onto the object to be exposed; and performing predetermined processes for the object exposed.

12. A device fabricating method comprising the steps of:

exposing an object to be exposed using an exposure apparatus comprising a correction apparatus for correcting a shift between optical paths in two optical units adapted such that a beam emitted from one unit enters the other, said correction apparatus comprising a converter for converting a shift between the optical paths into an angular shift, and an angular corrector for correcting the angular shift, and an optical system for projecting a pattern formed on a reticle or mask onto the object to be exposed; and performing predetermined processes for the object exposed.

13. A device fabricating method comprising the steps of:

exposing an object to be exposed using an exposure apparatus comprising a correction apparatus for correcting a shift between optical axes in two separate optical units adapted such that a beam emitted from one unit enters the other, said correction apparatus comprising a first angular corrector for correcting an angular shift between the optical axes, a converter for converting a positional shift between the optical axes into an angular shift, and a second angular corrector for correcting the converted angular shift, and an optical system for projecting a pattern formed on a reticle or mask onto the object to be exposed; and performing predetermined processes for the object exposed.

* * * * *